United States Patent
Kim et al.

(10) Patent No.: US 8,897,068 B2
(45) Date of Patent: Nov. 25, 2014

(54) SEMICONDUCTOR MEMORY DEVICE

(75) Inventors: Beom Sik Kim, Seoul (KR); Young Soo Park, Seoul (KR)

(73) Assignee: SK Hynix Inc., Gyeonggi-do (KR)

( * ) Notice: Subject to any disclaimer, the term of this patent is extended or adjusted under 35 U.S.C. 154(b) by 210 days.

(21) Appl. No.: 13/452,236

(22) Filed: Apr. 20, 2012

(65) Prior Publication Data
US 2012/0268992 A1 Oct. 25, 2012

(30) Foreign Application Priority Data

Apr. 21, 2011 (KR) .......................... 10-2011-0037171

(51) Int. Cl.
*G11C 16/04* (2006.01)
*G11C 16/34* (2006.01)

(52) U.S. Cl.
CPC ........ *G11C 16/0483* (2013.01); *G11C 16/3418* (2013.01)

USPC ...................................................... 365/185.11

(58) Field of Classification Search
None
See application file for complete search history.

(56) References Cited

U.S. PATENT DOCUMENTS 5,532,971 A * 7/1996 Tanaka et al. ............ 365/230.06

* cited by examiner

*Primary Examiner* — James G Norman
(74) *Attorney, Agent, or Firm* — William Park & Associates Patent Ltd.

(57) ABSTRACT

A semiconductor memory device includes a memory cell array configured to include a plurality of memory blocks, a voltage generator configured to output operating voltages for data input and output to global lines, and a row decoder configured to transfer the operating voltages to local lines of a memory block, selected from among the plurality of memory blocks, and supply a ground voltage to local lines of unselected memory blocks in response to address signals.

18 Claims, 5 Drawing Sheets

SEMICONDUCTOR MEMORY DEVICE

CROSS-REFERENCE TO RELATED APPLICATION

Priority to Korean patent application number 10-2011-0037171 filed on Apr. 21, 2011, the entire disclosure of which is incorporated by reference herein, is claimed.

BACKGROUND

1. Field of Invention

Various embodiments of the present invention relate generally to a semiconductor memory device and, more particularly, to a semiconductor memory device having an improved data retention characteristic.

2. Description of Related Art

A NAND flash memory device is a type of non-volatile semiconductor memory devices. In a NAND flash memory device, the threshold voltage of a memory cell is shifted and the data stored in each memory cell is determined based on the amount of electrons injected into the floating gate of the memory cell. In order to retain the data stored in a memory cell, the electrons injected into the floating gate need to be minimized.

With increasing degree of high integration for larger data storage capacity, the intervals between the memory cells are narrowed, which leads to increased parasitic capacitance between the memory cells. Then, when a high voltage is applied to a memory cell, the high voltage is also transferred to the adjacent memory cells because of the capacitor coupling phenomenon, and the electrons are discharged from the floating gate of the memory cell due to the high voltage.

Particularly, during the data input and output (I/O) operations, the data stored in the unselected memory cells may be altered depending on the voltage applied to a bulk (e.g., a P well) in which the bit lines are placed over the memory cells because the electrons stored in the floating gates of the unselected memory cells are discharged when the voltage is applied to the unselected memory cells.

BRIEF SUMMARY

Embodiments relate to a semiconductor memory device capable of improving a data retention characteristic by preventing data, stored in the memory cells of an unselected memory block, from being altered in data input and output operations.

A semiconductor memory device according to an aspect of the present disclosure includes a memory cell array configured to include a plurality of memory blocks, a voltage generator configured to output operating voltages for data input and output to global lines, and a row decoder configured to transfer the operating voltages to local lines of a memory block, selected from among the plurality of memory blocks, and supply a ground voltage to local lines of unselected memory blocks in response to address signals.

A semiconductor memory device according to another aspect of the present disclosure includes a plurality of memory planes each configured to comprise a plurality of memory blocks, and a row decoder configured to transfer operating voltages to local lines of memory blocks, selected from among memory blocks of the plurality of memory planes, respectively, and supply a ground voltage to local lines of unselected memory blocks of the plurality of memory planes in response to address signals.

In still another embodiment a method of supplying voltages to memory cells comprises providing operating voltages to local lines of at least one memory block, where the at least one memory block is selected from a plurality of memory blocks, where a plurality of memory planes include the plurality of memory blocks; and supplying a ground voltage to the local lines of unselected memory blocks of the plurality of memory planes, where the operating voltages are transferred in response to address signals.

DESCRIPTION OF EMBODIMENTS

Hereinafter, various embodiments of the present disclosure will be described in detail with reference to the accompanying drawings. The figures are provided to allow those having ordinary skill in the art to understand the scope of the embodiments of the disclosure.

Figure 1:
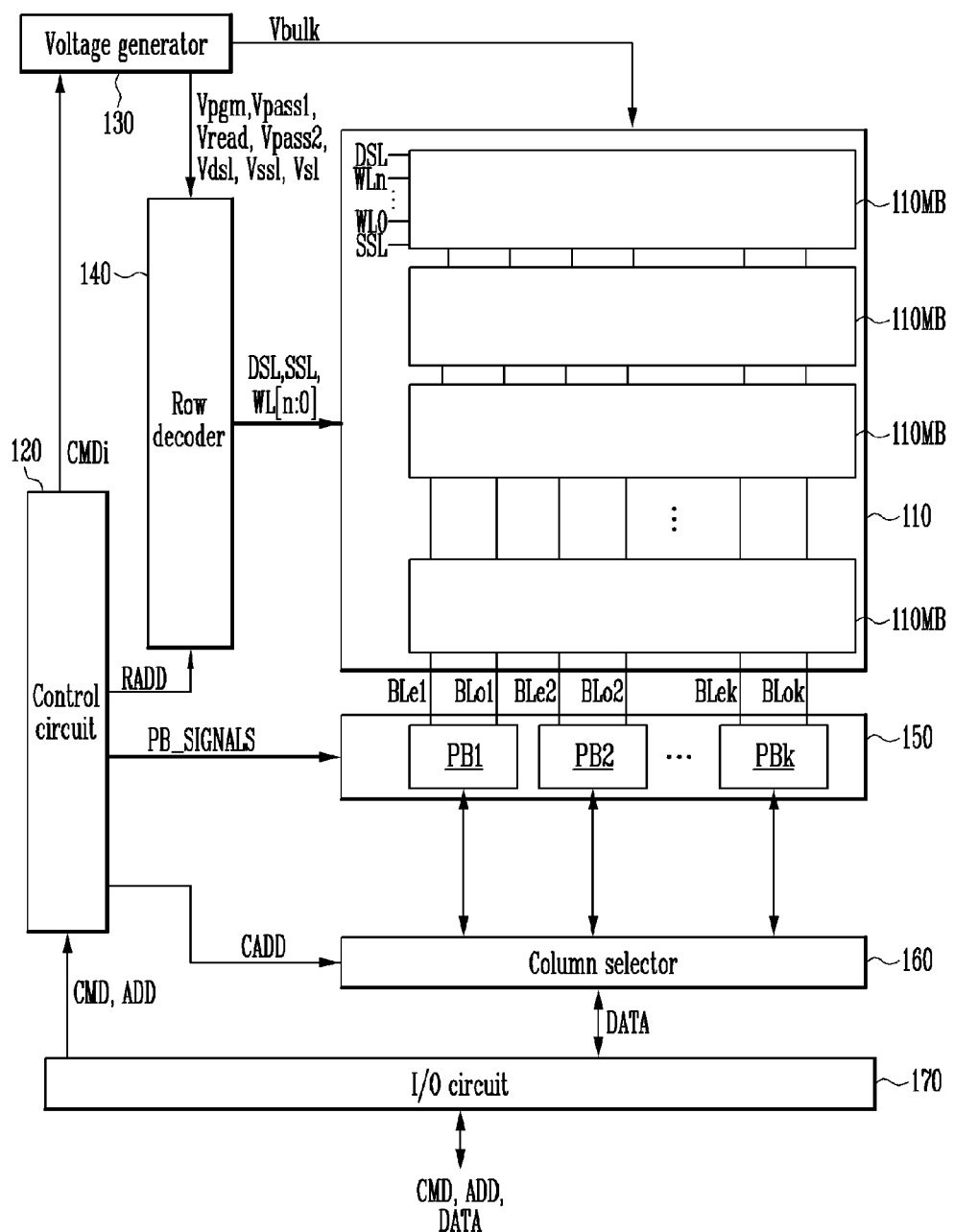
FIG. 1 is a block diagram of a semiconductor memory device an exemplary embodiment of this disclosure.

FIG. 1 is a block diagram of a semiconductor memory device according to an embodiment of this disclosure.

Referring to FIG. 1, the semiconductor memory device includes a memory cell array 110 including a plurality of memory blocks 110MB, a voltage generator 130, and a row decoder 140, among others. The semiconductor memory device may further include a plurality of page buffer groups 150 (only one page buffer group is shown as an example) for controlling or sensing the voltages of bit lines BLe1 to BLek and BLo1 to BLok in data I/O operations and a column selector 160 for controlling the transfer of data between the page buffer groups 150 and an I/O circuit 170. In a program operation and a read operation related to the data I/O operations, the operation circuits (such as 130, 140, 150, 160, 170) are controlled by a control circuit 120. The elements are described in detail below.

Figure 2:
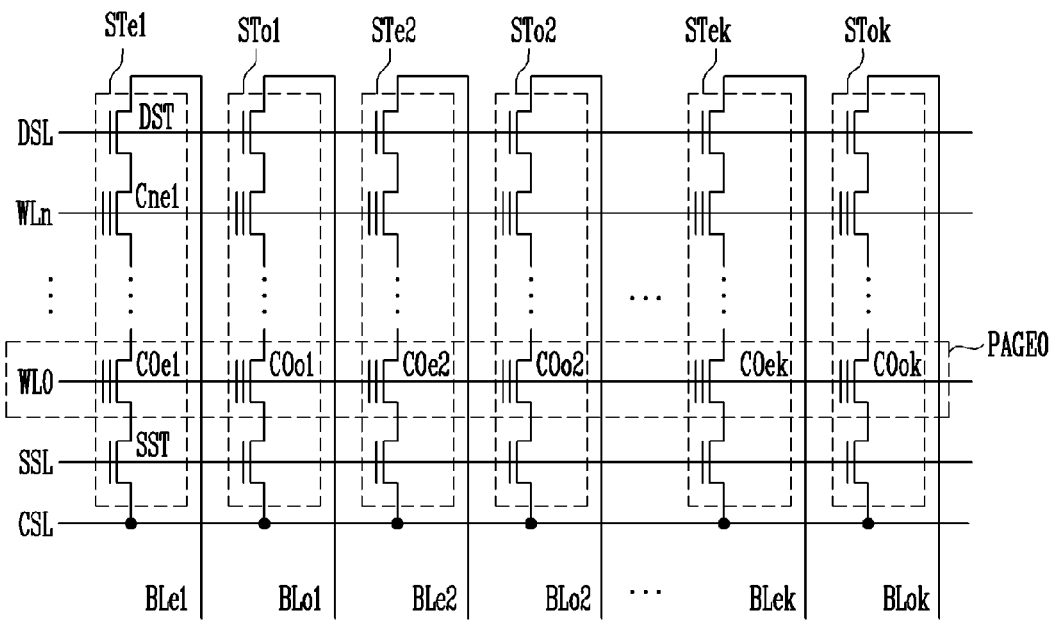
FIG. 2 is a circuit diagram of a memory block shown in FIG. 1.
Figure 3:
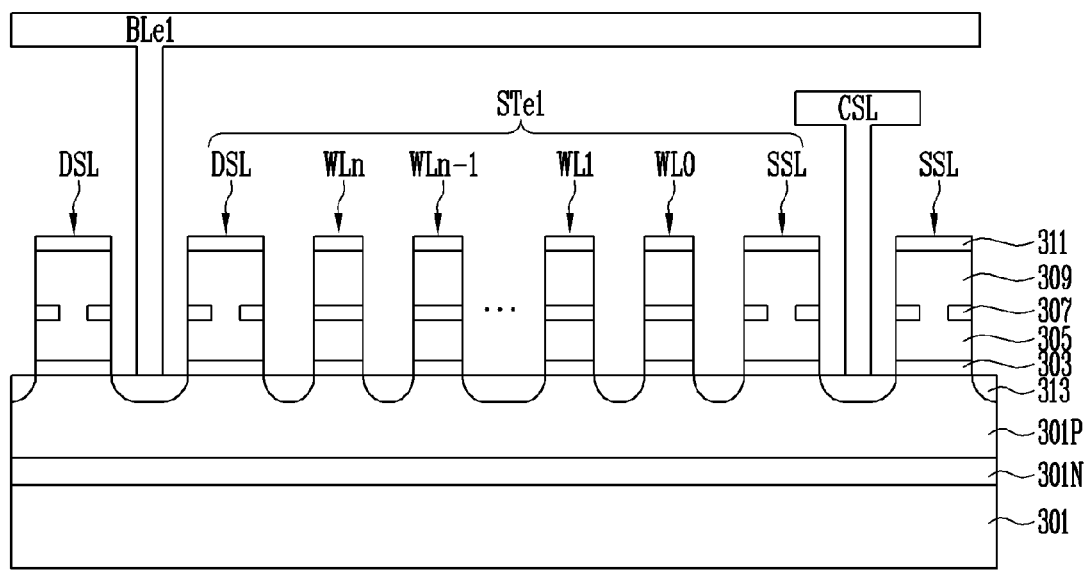
FIG. 3 is a diagram illustrating the cross section of the memory string shown in FIG. 2.

FIG. 2 is the circuit diagram of a memory block shown in FIG. 1. FIG. 3 is a diagram illustrating the cross section of a memory string (the memory string Ste1 as an example) shown in FIG. 2.

Referring to FIGS. 2 and 3, each of the memory block 110MB includes a plurality of strings STe1 to STek and STo1 to STok coupled between the respective bit lines BLe1 to BLek and BLo1 to BLok and a common source line CSL. More specifically, the strings STe1 to STek, STo1 to STok are coupled to the respective bit lines BLe1 to BLek and BLo1 to BLok and are in common coupled to the common source line CSL. Each (e.g., STe1) of the memory strings includes a source select transistor SST having a source coupled to the common source line CSL, a plurality of memory cells C0e1 to Cne1, and a drain select transistor DST having a drain coupled to the bit line BLe1. The memory cells C0e1 to Cne1 are coupled in series between the select transistors SST and DST. The gate of the source select transistor SST is coupled to a source select line SSL, the gates of the memory cells C0e1 to Cne1 are coupled to respective word lines WL0 to WLn, and the gate of the drain select transistor DST is coupled to a drain select line DSL.

The memory cells C0e1 to Cne1 and the select transistors SST and DST are formed in the well region of the semiconductor substrate 301.

More specifically, now referring to FIG. 3, an N well 301N is formed in a semiconductor substrate 301, a P well 301P is formed in the N well 301N, and the memory cells C0e1 to Cne1 and the select transistors SST and DST are formed over the P well 301P. The P well 301P may become a bulk. The word lines WL0 to WLn are coupled to the memory cells C0e1 to Cne1, respectively, and the select lines SSL and DSL are coupled to the select transistors SST and DST, respectively, and all of which include gate insulating layers 303, floating gates 305, dielectric layers 307, and control gates 309. A hard mask 311, which is used as an etch mask in an etch process, may be formed on the control gate 309. The dielectric layer 307 of each of the select transistors SST and DST is partially etched, and thus the floating gate 305 and the control gate 309 are coupled through the etched part of the dielectric layer 307. Junctions 313 are formed in the semiconductor substrate 301 between the local lines SSL, WL0 to WLn, and DSL. The junction 313 between the drain select lines DSL is coupled to the bit line BLe1, and the junction 313 between the source select lines SSL is coupled to the common source line CSL.

In a NAND flash memory device, the memory cells included in a memory cell block may be divided by a physical page or the logical page. For example, the memory cells C0e1 to C0ek, C0ek to C0ok coupled to a word line (e.g., WL0) may form a physical page PAGE0 as shown in FIG. 2. Furthermore, the even-numbered memory cells C0e1 to C0ek coupled to the word line WL0 may form an even physical page, and the odd-numbered memory cells C0o1 to C0ok coupled to the word line WL0 may form an odd physical page. The page (or the even page and the odd page) is a basic unit for a program operation or a read operation.

Referring to FIGS. 1 and 2, the control circuit 120 generates a command signal CMDi for performing a program operation or a read operation in response to external command signals CMD received via the I/O circuit 170 and generates PB control signals PB_SIGNALS for controlling the page buffers PB1 to PBk of the page buffer groups 150 depending on a type of an operation. Furthermore, the control circuit 120 generates row address signals RADD and column address signals CADD in response to external address signals ADD received via the I/O circuit 170.

The voltage generator 130 outputs operating voltages (e.g., Vpgm, Vread, Vpass1, Vpass2, Vdsl, Vssl, etc.) for the program operation or the read operation of memory cells to global lines (refer to GSSL, GWL0 to GWLn, and GDSL of FIG. 4) in response to the command signal CMDi and outputs a bulk voltage Vbulk to the bulk in which the memory blocks 110MB are formed.

For example, in a program operation, the voltage generator 130 may supply the global lines with the program voltage Vpgm to be provided to the memory cells of a selected page, the program pass voltage Vpass1 to be provided to unselected memory cells, and the select voltages Vdsl and Vssl to be provided to the select transistors DST and SST. In a read operation, the voltage generator 130 may supply the global lines with the read voltage Vread to be provided to the memory cells of a selected page, the read pass voltage Vpass2 to be provided to unselected memory cells, and the select voltages Vdsl and Vssl to be provided to the select transistors DST and SST.

Particularly, the voltage generator 130 may generate the bulk voltage Vbulk of 0 V in a standby mode. If the memory blocks 110MB are classified into a plurality of memory planes, the voltage generator 130 outputs the bulk voltage Vbulk to the memory planes and outputs the bulk voltage Vbulk of 0 V to unselected memory planes (i.e., memory planes not including a selected memory block) in data I/O operations.

The row decoder 140 transfers the operating voltages Vpgm, Vread, Vpass1, Vpass2, Vdsl, and Vssl to the local lines SSL, WN0 to WLn, and DSL of a memory block, selected from among the memory blocks 110MB of the memory cell array 110 and supplies a ground voltage to the local lines of unselected memory blocks, in response to the row address signals RADD. The row decoder 140 is described in detail below.

Figure 4:
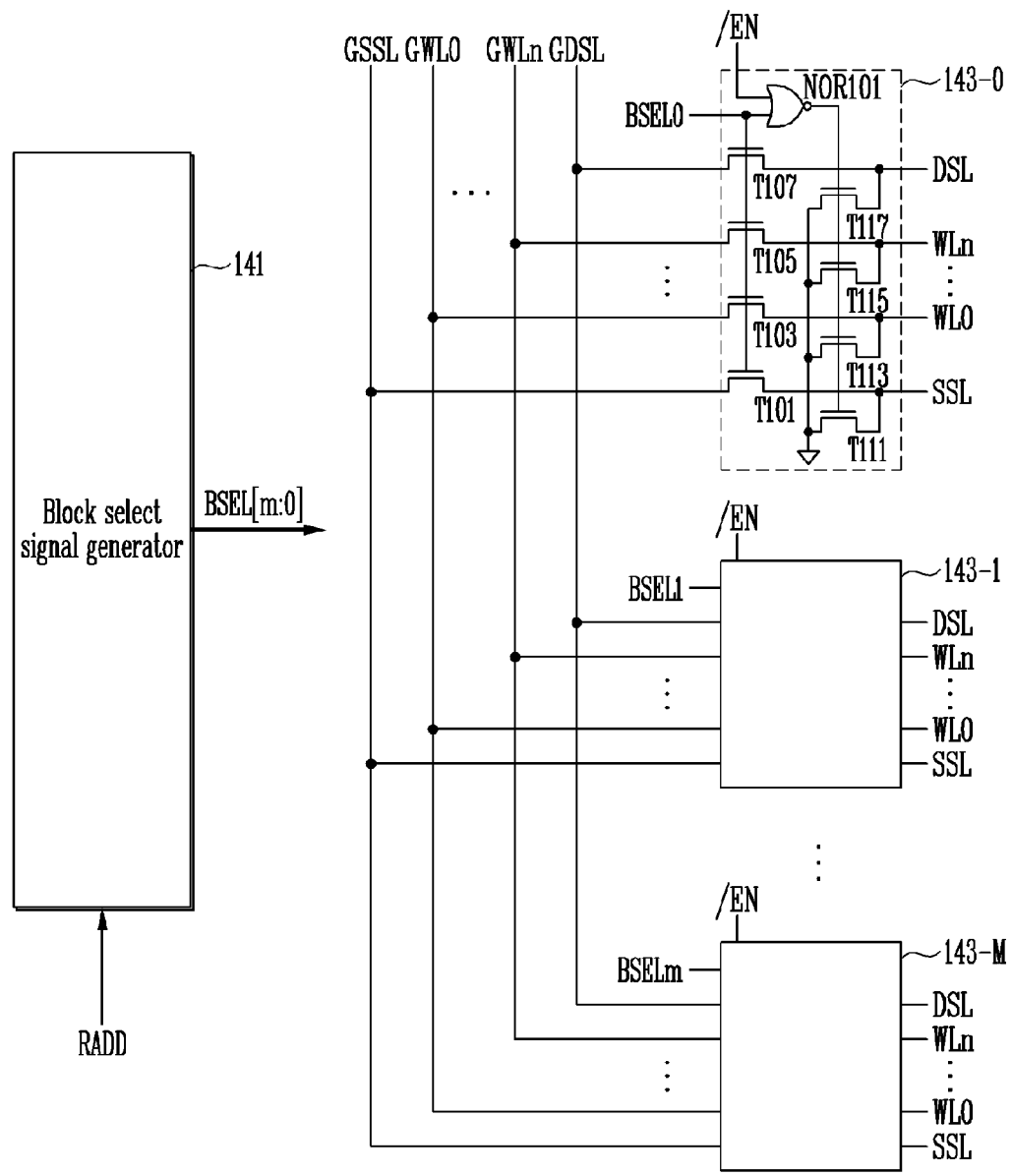
FIG. 4 is a circuit diagram of a row decoder shown in FIG. 1.

FIG. 4 is a circuit diagram of the row decoder 140 shown in FIG. 1.

Referring to FIG. 4, the row decoder 140 includes a block select signal generator 141 and coupling circuits 143-0 to 143-M. The block select signal generator 141 generates block select signals BSEL[m:0] for selecting one of the memory blocks 100MB in response to the row address signals RADD of the address signals ADD. The coupling circuits 143-0 to 143-M couple the local lines SSL, WN0 to WLn, and DSL of the selected memory block 110MB and the global lines GSSL, GWN0 to GWLn, and GDSL and couples the local lines of unselected memory blocks and a ground terminal, in response to the block select signals BSEL[m:0] and an enable signal /EN. Each of the coupling circuits 143-0 to 143-M is coupled to the local lines SSL, WN0 to WLn, and DSL of the memory block 110MB, and the coupling circuits 143-0 to 143-M are in common coupled to the global lines GSSL, GWN0 to GWLn, and GDSL.

Each of the coupling circuits (e.g., 143-0) includes first switching elements T101, T103 to T105, and T107 coupled between the respective global lines GSSL, GWN0 to GWLn, and GDSL and the respective local lines SSL, WN0 to WLn, and DSL of the memory block 110MB, and the coupling circuit 143-0 may be operated in response to a block select signal BSEL0. Each of the coupling circuits (143-0 to 143-M) may be operated in response to a different block select signal. For example, coupling circuit 143-1 may be operated in response to block select signal BSEL1, and coupling circuit 143-M may be operated in response to select signal BSELm, etc. Each coupling circuit (e.g., 143-0) may further include a logical element NOR101 configured to have the block select signal BSEL0 and the enable signal /EN inputted thereto. Each of the coupling circuits (e.g., 143-0) may also include second switching elements T111, T113 to T115, and T117 coupled between the respective local lines SSL, WN0 to WLn, and DSL and the ground terminal in order to transfer a ground voltage to the local lines SSL, WN0 to WLn, and DSL in response to the output signal of the logical element NOR101. The logical element NOR101 may be a NOR gate.

Referring to FIGS. 1 and 4, the row decoder 140 couples the global lines and the local lines DSL, WL0 to WLn, and SSL in response to the row address signals RADD of the control circuit 120 so that the operating voltages provided from the voltage generator 130 to the global lines GSSL, GWN0 to GWLn, and GDSL can be transferred to the local lines DSL, WL0 to WLn, and SSL of a selected memory block 110MB. Furthermore, the row decoder 140 supplies the ground voltage to the local lines DSL, WL0 to WLn, and SSL of unselected memory blocks. Thus, the program voltage Vpgm or the read voltage Vread is provided from the voltage generator 130 to a local word line (e.g., WL0), coupled to a selected memory cell (e.g., C0e1) of the selected memory block, via the global word line. Furthermore, the program pass voltage Vpass1 or the read pass voltage Vpass2 is provided from the voltage generator 130 to the local word lines WL1 to WLn, coupled to the unselected memory cells C1e1 to Cne1, via the global word lines. Accordingly, data is stored in the selected memory cell C0e1 by the program voltage Vpgm, and data stored in the selected memory cell C0e1 is read by the read voltage Vread.

Referring to FIGS. 1 and 2, each of the page buffer groups 150 includes the page buffers PB1 to PBk coupled to the bit lines BLe1 to BLek and BLo1 to BLok. Each of the page buffers PB1 to PBk of the page buffer group 150 may be coupled to an even bit line and an odd bit line. The page buffers PB1 to PBk selectively precharge the bit lines BLe1 to BLek or BLo1 to BLok in order to store data in the memory cells C0e1 to C0ek or C0o1 to C0ok, or sense the voltages of the bit lines BLe1 to BLek or BLo1 to BLok in order to read data from the memory cells C0e1 to C0ek or C0o1 to C0ok, in response to the PB control signals PB_SIGNALS.

For example, in a program operation, when program data (e.g., data '0') is inputted to the page buffer PB1 in order to store the program data in the memory cell C0e1, the page buffer PB1 supplies a program permission voltage (e.g., a ground voltage) to the bit line BLe1 coupled to the memory cell C0e1. Thus, the threshold voltage of the memory cell C0e1 rises owing to the program voltage Vpgm provided to the word line WL0 coupled to the memory cell C0e1 and the program permission voltage provided to the bit line BLe1.

For another example, in a program operation, when erase data (e.g., data '1') is inputted to the page buffer PB1 in order to store the erase data in the memory cell C0e1, the page buffer PB1 supplies a program inhibition voltage (e.g., a power source voltage) to the bit line BLe1 coupled to the memory cell C0e1. Although the program voltage Vpgm is provided to the word line WL0, the threshold voltage of the memory cell C0e1 does not rise because of the program inhibition voltage provided to the bit line BLe1. As described above, different data may be stored in a memory cell because the threshold voltage of the memory cell is shifted.

In a read operation, the page buffer group 150 precharges all bit lines (e.g., BLe1 to BLek), selected from among the even bit lines BLe1 to BLek and the odd bit lines BLo1 to BLok, and discharges all unselected bit lines (e.g., BLo1 to BLok). Furthermore, when the voltage supply circuit (130 and 140) supplies the read voltage Vread to the selected word line WL0, bit lines coupled to memory cells in which program data is stored maintains a precharge state, and bit lines coupled to memory cells in which erase data are stored, are discharged. The page buffer group 150 senses a change in the voltages of the bit lines BLe1 to BLek and latches the data of the memory cells corresponding to the result of sensing the bit lines BLe1 to BLek.

The column selector 160 selects the page buffers PB1 to PBk of the page buffer group 150 in response to the column address signals CADD. That is, the column selector 160 sequentially transfers data to be stored in memory cells to the page buffers PB1 to PBk in response to the column address signals CADD. Furthermore, the column selector 160 may also sequentially select the page buffers PB1 to PBk in response to the column address signals CADD to externally output data of memory cells latched in the page buffers PB1 to PBk by a read operation.

The I/O circuit 170 transfers external data DATA to the column selector 160 under control of the control circuit 120 in a program operation so that the external data is inputted to the page buffer group 150 in order to be stored in memory cells. When the column selector 160 transfers the external data to the page buffers PB1 to PBk as described above, the page buffers PB1 to PBk store the external data in their internal latch circuits. Furthermore, in a read operation, the I/O circuit 170 externally outputs data DATA received from the page buffers PB1 to PBk via the column selector 160.

An operation of the semiconductor memory device according to an embodiment of this disclosure is described below.

The control circuit 120 generates the command signal CMDi for a program operation or a read operation in response to the command signals CMD, and the control circuit 120 generates the row address signals RADD and the column address signals CADD in response to the address signals ADD.

In a program operation, the column selector 160 sequentially transfers external data, received via the I/O circuit 170, to the page buffers PB1 to PBk in response to the column address signals CADD. The page buffers PB1 to PBk latch the received data. Furthermore, the page buffers PB1 to PBk selectively supply the program inhibition voltage and the program permission voltage to bit lines, selected from among the bit lines BLe1 to BLek and BLo1 to BLok, depending on whether the latched data is program data (e.g., data '0') or erase data (e.g., data '1').

The voltage generator 130 generates the operating voltages Vpgm, Vpass1, Vdsl and Vssl, Vsl, and Vbulk for the program operation in response to the command signal CMDi. The row decoder 140 couples the global lines GSSL, GWN0 to GWLn, and GDSL and the respective local lines SSL, WN0 to WLn, and DSL of a memory block, selected from among the memory blocks 110MB, in response to the row address signals RADD. Accordingly, the threshold voltage of a memory cell is shifted according to the operating voltages Vpgm, Vpass1, Vdsl, and Vssl provided to the local lines SSL, WN0 to WLn, and DSL of the selected memory block 110MB. The threshold voltage of the memory cell may also be shifted according to the program permission voltage or the program inhibition voltage provided to the selected bit lines BLe1 to BLek or BLo1 to BLok, and data '0' or data '1' are stored in the memory cell.

The row decoder 140 supplies the ground voltage to the local lines SSL, WN0 to WLn, and DSL of the unselected memory blocks. When the ground voltage is provided to the local lines SSL, WN0 to WLn, and DSL of the unselected memory blocks, although the voltages of the bit lines BLe1 to BLek and BLo1 to BLok rise, a change of data stored in memory cells due to the discharge of electrons from the floating gates of the memory cells owing to a capacitor coupling phenomenon can be prevented.

In a read operation, as in the program operation, when the row decoder 140 supplies the ground voltage to the local lines SSL, WN0 to WLn, and DSL of the unselected memory blocks, although the voltages of the bit lines BLe1 to BLek and BLo1 to BLok rise, the discharge of electrons injected into the floating gates of memory cells due to a capacitor coupling phenomenon can be prevented.

If the memory block groups 110MB are classified into a plurality of memory planes, a change of data stored in memory cells due to the discharge of electrons from the floating gates of the memory cells can be prevented by supplying the ground voltage to the local lines SSL, WN0 to WLn, and DSL of unselected memory planes or unselected memory blocks. This is described in detail below.

Figure 5:
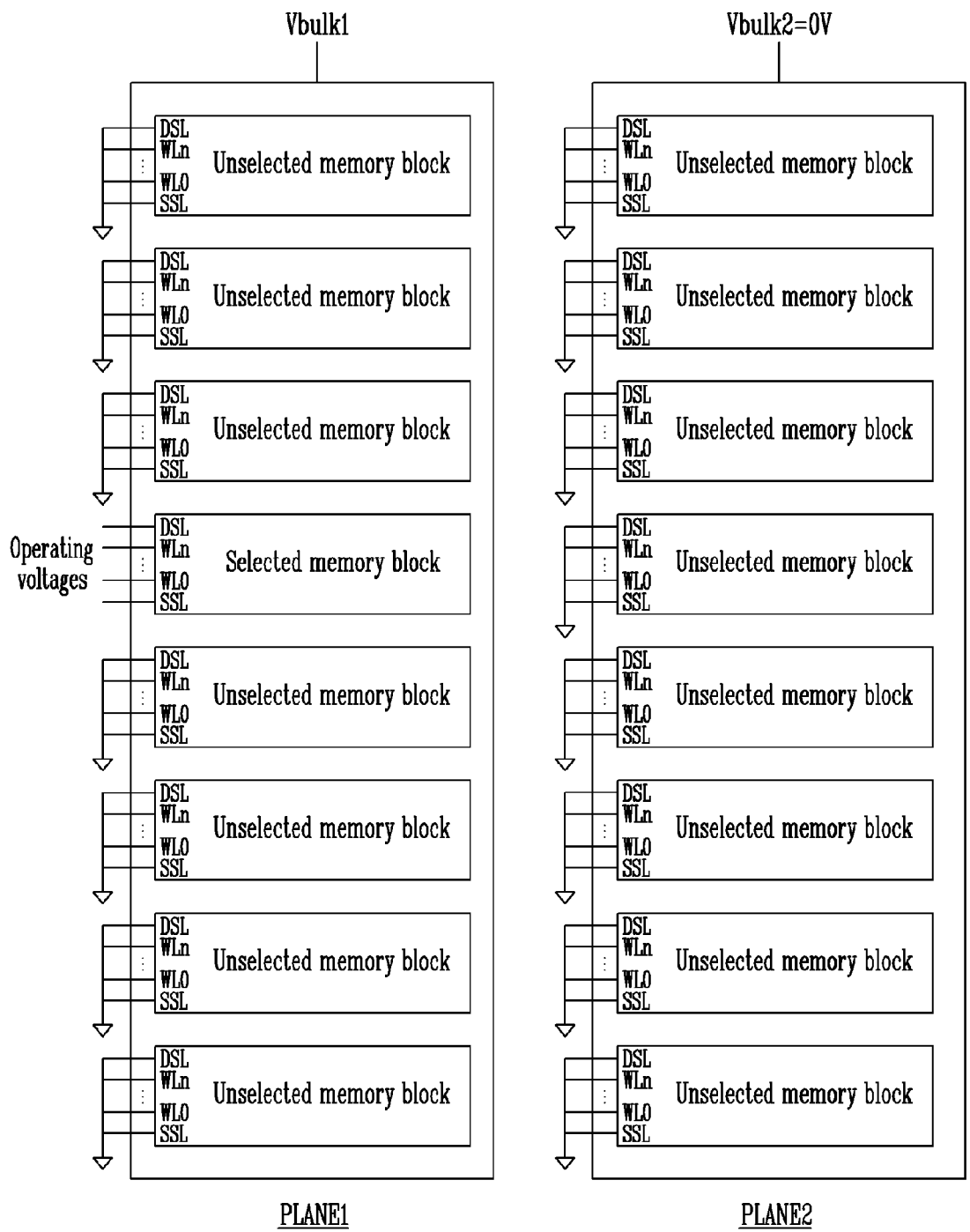
FIGS. 5 and 6 are block diagrams of a semiconductor memory device according to another exemplary embodiment of this disclosure.
Figure 6:
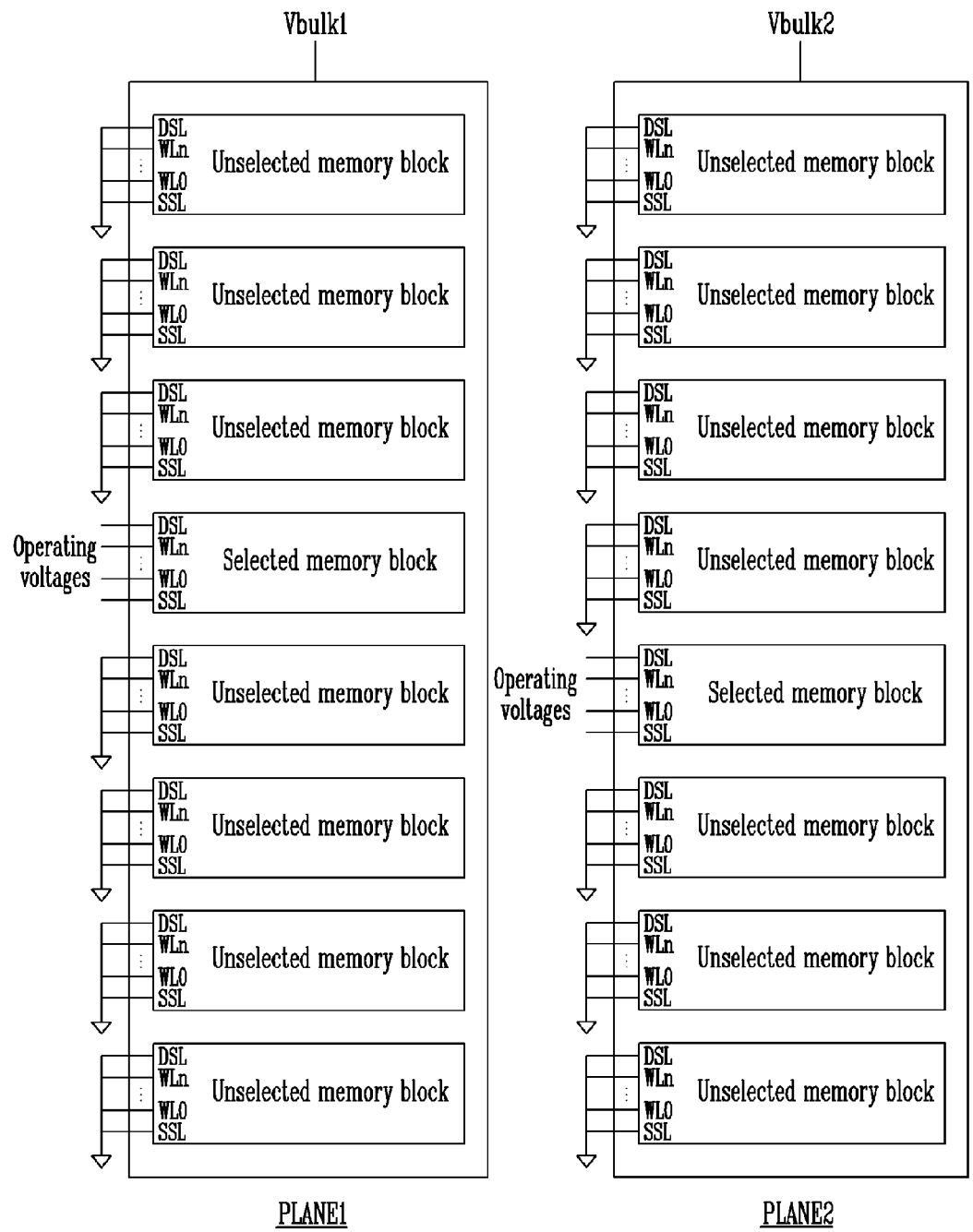

FIGS. 5 and 6 are block diagrams of a semiconductor memory device according to another exemplary embodiment of this disclosure.

The semiconductor memory devices of FIGS. 5 and 6 have substantially similar construction as the semiconductor memory device of FIGS. 1 to 4 except for the construction of memory planes, and therefore a detailed description of the substantially similar component is thereof omitted.

Referring to FIGS. 1 to 5, if memory blocks are divided into two memory planes PLANE1 and PLANE2, a program operation or a read operation may be performed on a memory block selected from among the memory blocks of one memory plane (e.g., PLANE1).

The row decoder 140 transfers the operating voltages for a program operation or a read operation to the local lines SSL, WN0 to WLn, and DSL of the selected memory block of one memory plane. Furthermore, the row decoder 140 couples the ground terminal and the local lines SSL, WN0 to WLn, and DSL of the remaining unselected memory blocks of the memory planes PLANE1 and PLANE2. In particular, the voltage generator 130 supplies a bulk voltage Vbulk2 having the same level as the ground voltage to the bulk of the memory plane PLANE2—which does not include the selected memory block—and supplies a bulk voltage Vbulk1 for the program operation or the read operation to the bulk of the memory plane PLANE1, which includes the selected memory block.

The block select signal generator 141 of the row decoder 140 includes the coupling circuits 143-0 to 143-M for generating the block select signals BSEL[m:0] for selecting one of the memory blocks of the memory plane PLANE1 in response to the row address signals RADD, coupling the local lines SSL, WN0 to WLn, and DSL of the selected memory block 110MB and the global lines GSSL, GWN0 to GWLn, and GDSL as described above in response to the block select signals BSEL[m:0] and the enable signal /EN. The coupling circuits 143-0 to 143-M may also couple the local lines SSL, WN0 to WLn, and DSL of the unselected memory blocks 110MB of the memory plane PLANE1 and the ground terminal.

In a standby mode, the row decoder 140 supplies the ground voltage to the local lines SSL, WN0 to WLn, and DSL of all the memory blocks 110MB of the memory planes PLANE1 and PLANE2, and the voltage generator 130 supplies the bulk voltages Vbulk1 and Vbulk2 having the same level as the ground voltage to a bulk in which the memory planes PLANE1 and PLANE2 are formed.

When the ground voltage is provided to the local lines SSL, WN0 to WLn, and DSL of the unselected memory blocks and the bulk as described above, electrons injected into the floating gates of memory cells included in the unselected memory blocks can be prevented from being discharged due to a capacitor coupling phenomenon occurring in the program operation or the read operation for the selected memory block.

Referring to FIGS. 1 to 4 and 6, memory blocks are divided into two memory planes PLANE1 and PLANE2. A program operation or a read operation may be simultaneously performed on two memory blocks respectively selected from the two memory planes PLANE1 and PLANE2.

The row decoder 140 transfers the operating voltages for a program operation or a read operation to the local lines SSL, WN0 to WLn, and DSL of the selected memory blocks of the memory planes PLANE1 and PLANE2. Furthermore, the row decoder 140 couples the ground terminal and the local lines SSL, WN0 to WLn, and DSL of the remaining unselected memory blocks of the memory planes PLANE1 and PLANE2. Since both the memory planes PLANE1 and PLANE2 include selected memory blocks, the voltage generator 130 supplies bulk voltages Vbulk1 and Vbulk2 to the bulk of the respective memory planes PLANE1 and PLANE2.

To this end, the block select signal generator 141 of the row decoder 140 include the coupling circuits 143-0 to 143-M for generating the block select signals BSEL[m:0] for selecting one of the memory blocks 110MB of each of the memory planes PLANE1 and PLANE2 in response to the row address signals RADD, coupling the local lines SSL, WN0 to WLn, and DSL of the selected memory block 110MB and the global lines GSSL, GWN0 to GWLn, and GDSL in response to the block select signals BSEL[m:0] and the enable signal /EN. The coupling circuits 143-0 to 143-M may also couple the local lines SSL, WN0 to WLn, and DSL of the unselected memory blocks 110MB and the ground terminal.

Furthermore, in a standby mode, the row decoder 140 supplies the ground voltage to all the local lines SSL, WN0 to WLn, and DSL of all the memory blocks 110MB included in the memory planes PLANE1 and PLANE2. The voltage generator 130 supplies the bulk voltages Vbulk1 and Vbulk2 having the same level as the ground voltage to the bulk in which the memory planes PLANE1 and PLANE2 are formed.

When the ground voltage is provided to the local lines SSL, WN0 to WLn, and DSL of the unselected memory blocks 110MB and the bulk as described above, electrons injected into the floating gates of memory cells included in the unselected memory blocks can be prevented from being discharged owing to a capacitor coupling phenomenon occurring in the program operation or the read operation for the selected memory block.

In accordance with the present disclosure, a data retention characteristic can be improved by preventing data of memory cells, included in unselected memory blocks, from being altered in data I/O operations.

What is claimed is:

1. A semiconductor memory device, comprising:
   a memory cell array configured to comprise a plurality of memory blocks;
   a voltage generator configured to output operating voltages for data input and output to global lines; and
   a row decoder configured to transfer the operating voltages to local lines of a memory block, selected from among the plurality of memory blocks, and including transistors connected between local lines of the plurality of memory blocks and ground terminal,
   wherein the row decoder operates the transistors connected between the local lines of unselected memory blocks and the ground terminal in response to block select signals so as to supply a ground voltage to the local lines of the unselected memory blocks.

2. The semiconductor memory device of claim 1, wherein the row decoder supplies the ground voltage to the local lines of the plurality of memory blocks in a standby mode.

3. The semiconductor memory device of claim 1, wherein the row decoder comprises:
   a block select signal generator for generating the block select signals for selecting one of the plurality of memory blocks in response to a row address signal of the address signals; and
   coupling circuits for coupling the local lines of the selected memory block and the global lines in response to one of the block select signals and an enable signal, and coupling the local lines of the unselected memory blocks and the ground terminal by using the transistors.

4. The semiconductor memory device of claim 3, wherein the coupling circuits are coupled to the local lines of the plurality of respective memory blocks and are in common coupled to the global lines.

5. The semiconductor memory device of claim 3, wherein each of the coupling circuits comprises:
   first switching elements coupled between the respective global lines and the respective local lines of one of the memory blocks and is operated in response to one of the block select signals;
   a logical element configured to have at least one of the block select signals and the enable signal are inputted; and
   second switching elements including the transistors coupled between the respective local lines and the ground terminal and configured to transfer the ground voltage to the local lines in response to an output signal of the logical element.

6. The semiconductor memory device of claim 5, wherein the logical element is a NOR gate.

7. The semiconductor memory device of claim 1, wherein the voltage generator supplies the ground voltage to a bulk in which the memory blocks are formed in a standby mode.

8. A semiconductor memory device, comprising:
   a plurality of memory planes each configured to comprise a plurality of memory blocks; and
   a row decoder configured to transfer operating voltages to local lines of memory blocks, selected from among memory blocks of the plurality of memory planes, respectively, and including transistors connected between local lines of the plurality of memory blocks and ground terminal,
   wherein the row decoder operates the transistors connected between the local lines of unselected memory blocks and the ground terminal in response to address signals so as to supply a ground voltage to the local lines of the unselected memory blocks, and
   wherein the ground voltage is supplied to a bulk in which the memory planes are formed in a standby mode.

9. The semiconductor memory device of claim 8, wherein the ground voltage is supplied to a bulk in which a memory plane not including the selected memory block, from among the plurality of memory planes, is formed.

10. The semiconductor memory device of claim 8, wherein the row decoder supplies the ground voltage to the local lines of the memory blocks of the plurality of memory blocks in a standby mode.

11. The semiconductor memory device of claim 8, wherein the row decoder comprises:

a block select signal generator for generating block select signals for selecting one of the memory blocks of one of the plurality of memory planes in response to a row address signal of the address signals; and
   coupling circuits for coupling the local lines of the selected memory block and global lines in response to one of the block select signals and an enable signal and coupling the local lines of the unselected memory blocks and the ground terminal by using the transistors.

12. The semiconductor memory device of claim 11, wherein the coupling circuits are coupled to the local lines of the plurality of respective memory blocks and are in common coupled to the global lines.

13. The semiconductor memory device of claim 11, wherein each of the coupling circuits comprises:
   first switching elements coupled between the respective global lines and the respective local lines of one of the memory blocks and operated in response to one of the block select signals;
   a logical element configured to have one of the block select signals and the enable signal are inputted; and
   second switching elements including the transistors coupled between the respective local lines and the ground terminal and configured to transfer the ground voltage to the local lines in response to an output signal of the logical element.

14. The semiconductor memory device of claim 13, wherein the logical element is a NOR gate.

15. A method of supplying voltages to memory cells comprises:
   providing operating voltages to local lines of at least one memory block, where the at least one memory block is selected from a plurality of memory blocks, where a plurality of memory planes include the plurality of memory blocks;
   supplying a ground voltage to the local lines of unselected memory blocks, where the operating voltages are transferred in response to address signals; and
   supplying the ground voltage to a bulk of a memory plane not including the selected memory block.

16. The method of claim 15, where in the ground voltage is supplied to the local lines of the unselected memory blocks in a standby mode.

17. The method of claim 15 further comprising supplying, in a standby mode, the ground voltage to a bulk in which the memory planes are formed.

18. The method of claim 15, wherein coupling circuits are coupled to the local lines and are in common coupled with global lines.

* * * * *